United States Patent
Boehl et al.

(10) Patent No.: US 9,000,818 B2
(45) Date of Patent: Apr. 7, 2015

(54) CIRCUIT CONFIGURATION AND METHOD FOR DISTRIBUTING PULSES WITHIN A TIME INTERVAL

(75) Inventors: Eberhard Boehl, Reutlingen (DE); Bernard Pawlok, Stuttgart (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 13/637,159

(22) PCT Filed: Mar. 16, 2011

(86) PCT No.: PCT/EP2011/053979
§ 371 (c)(1),
(2), (4) Date: Dec. 5, 2012

(87) PCT Pub. No.: WO2011/120807
PCT Pub. Date: Oct. 6, 2011

(65) Prior Publication Data
US 2013/0077733 A1 Mar. 28, 2013

(30) Foreign Application Priority Data
Mar. 31, 2010 (DE) .......................... 10 2010 003 542

(51) Int. Cl.
*H03K 3/017* (2006.01)
*H03K 21/00* (2006.01)
*G06F 7/68* (2006.01)

(52) U.S. Cl.
CPC . *H03K 21/00* (2013.01); *G06F 7/68* (2013.01)

(58) Field of Classification Search
USPC ................................. 327/171–176, 31, 35–37
See application file for complete search history.

(56) References Cited

U.S. PATENT DOCUMENTS

| 4,086,471 A | | 4/1978 | Takahashi |
| 4,258,333 A | * | 3/1981 | Demuliere et al. ............. 331/11 |
| 6,058,486 A | * | 5/2000 | Nakayama et al. ........... 713/500 |
| 6,112,217 A | | 8/2000 | Rohm et al. |

FOREIGN PATENT DOCUMENTS

| DE | 31 26 528 | 1/1983 |
| DE | 90 10 488 | 9/1990 |

(Continued)

OTHER PUBLICATIONS

Boutin, N. et al: "A Novel Digital Frequency Multiplier", IEEE Transactions on Instrumentation and Measurement, IEEE Service Center, Piscataway, NJ, vol. IM-35, No. 4, Part 2, Dec. 1, 1986, pp. 566-570.

(Continued)

*Primary Examiner* — An Luu
(74) *Attorney, Agent, or Firm* — Kenyon & Kenyon LLP

(57) ABSTRACT

A circuit configuration for generating pulses within a time interval on the basis of an input signal includes a counting unit, a comparator unit and a first adder circuit; the time interval being predicted on the basis of at least two defined changes in input signals; the circuit configuration being configured for triggering at the beginning of the time interval by the first adder circuit on the basis of clock pulses, for generating and outputting pulses; for counting a number of generated and output pulses using the counting unit; for comparing the counted number to a setpoint value using the comparator unit; and for ending the generation and outputting of the pulses in response to the reaching of the setpoint value or the ending of the time interval.

17 Claims, 1 Drawing Sheet

(56) References Cited

FOREIGN PATENT DOCUMENTS

| | | |
|---|---|---|
| DE | 41 00 866 | 5/1992 |
| EP | 1 101 162 | 5/2001 |
| EP | 1 160 659 | 12/2001 |
| GB | 1 434 450 | 5/1976 |
| GB | 1 446 474 | 8/1976 |

OTHER PUBLICATIONS

International Search Report for PCT/EP2011/053979, dated Sep. 13, 2011.

* cited by examiner

CIRCUIT CONFIGURATION AND METHOD FOR DISTRIBUTING PULSES WITHIN A TIME INTERVAL

BACKGROUND OF THE INVENTION

1. Field of the Invention

The present invention relates to a circuit configuration, as well as to a corresponding method for distributing pulses within a time interval on the basis of an input signal.

2. Description of the Related Art

Generally, a position of motors is monitored by sensors which output a signal in response to a specific position being reached. This could be a crankshaft pulse-generator wheel of a combustion engine which, upon reaching a specific rotary angle, outputs a signal for identifying a specific position. This type of signal output can also be implemented by sensors that indicate a change in a magnetization when working with electromotors having permanent magnets. However, a pulse-generator wheel can also be used for these motors, as in the case of combustion engines. A control unit is able to compute a rotational speed from a time interval between two such events if the corresponding differential angle is known. The output sensor signals also indicate the momentary position of the motor in question.

To be able to more precisely assign, respectively determine a position of a motor, a duration to be expected until the next event is predicted, and a predetermined number of pulses, that is output, is distributed over this time interval in accordance with the duration that is to be expected. A position counter, respectively what is generally referred to as an angular clock, sums these output pulses within the time interval by incrementation, thereby allowing for enhanced positional information.

In the case of a motor acceleration, it may, however, occur that a next event, which induces a sensor to output a signal, occurs already before all pulses of the most recent time interval have been output.

As explained above, the time interval is specified, respectively predefined by the time interval between two successive events. However, once the time intervals have been predicted with knowledge of a history of successive events, and a number of pulses is derived therefrom that is to be distributed over the predicted time interval, it can happen that the predicted time interval does not coincide with the actually occurring time interval, because two successive events follow each other at a shorter time interval, due, for example, to the motor acceleration just mentioned. It is conceivable in this case that the number of pulses that had been predefined on the basis of the predicted time interval and distributed accordingly, was not able to be completely output within the actual time interval. It is sometimes customary in such a case to output pulses, which have not yet been output, at a maximum possible frequency before the actual pulses, which are to be output for the now subsequent time interval, are generated. This means that all of the pulses, which were not able to be output during the preceding time interval, are output at a highest possible frequency at the beginning of a time interval. However, this may result in a corresponding position counter having to change the value thereof very quickly, and modules, which analyze this position counter value, not being able to react in the desired manner.

Accordingly, it appears to be useful to add the pulses, not output in a preceding time interval, to a number of pulses to be output in the current time interval and to uniformly distribute this total pulse number over the current time interval. Under known methods heretofore, such conditions had only been realized as software.

Against this background of the high load of the CPU that is available to the entire system, it would be desirable to provide a method for distributing a total pulse number over a current time interval using hardware without the support of the CPU that is available to the system.

BRIEF SUMMARY OF THE INVENTION

The circuit configuration provided in accordance with the present invention may be implemented, for example, in a system architecture mentioned at the outset and reduce the load on a CPU that is available to the system.

A circuit configuration for generating pulses within a time interval in response to an input signal encompasses a counting unit, a comparator unit and a first adder circuit. The time interval, respectively a duration of the time interval is predicted on the basis of two defined changes in input signals. The circuit configuration provided is configured for triggering at the beginning of the time interval by the first adder circuit on the basis of clock pulses, for generating and outputting pulses; for counting a number of generated and output pulses using the counting unit; for comparing the counted number of pulses to a setpoint value using the comparator unit; and for ending the generation and outputting of the pulses in response to the reaching of the setpoint value or the ending of the time interval; as a first input quantity, a sum output by the first adder circuit in a previous clock pulse, and second input quantity, at least one calculated data value being transmitted to the first adder circuit; and, upon calculation of the data value, a deviation in the number of the pulses output in a preceding time interval from the setpoint value and/or systematic deviations in the time interval being considered.

Through the use of hardware and without the support of a CPU, the circuit configuration presented in accordance with the present invention makes it possible to allow for deviations in a number of pulses to be output from a setpoint value and/or for systematic deviations in the time interval, without the risk of modules, which analyze the outputting of pulses and thus a position associated therewith, not being able to handle a succession of pulses.

One possible specific embodiment of the circuit configuration according to the present invention provides that the calculated data value correspond to a ratio between the number of pulses to be output within the time interval and the predicted duration of the time interval. This means that the calculated data value may correspond to a quotient, for example, whose numerator is given by the number of pulses to be output within the time interval, and whose denominator is given by the time interval. It is thereby also accomplished that the pulses to be output within a time interval are uniformly distributed over the time interval, even when the number of these output pulses is elevated in comparison to a given setpoint value due to deviations in a preceding time interval or systematic deviations in the time interval, and are not transmitted at an increased frequency during the first clock pulse, i.e., at the beginning of a time interval, as in related art methods.

For instance, at a predefined number of pulses n to be transmitted, it is conceivable for a further number m of pulses to be added, which, in a preceding time interval, had no longer been transmitted, and, in some instances, for pulses a to also be added thereto, which are to be additionally transmitted due to a systematic deviation. The number of pulses to be output within a current time interval is thereby derived as the sum of setpoint value n, deviation m in the number of pulses output in a preceding time interval from the setpoint value, and of a number of pulses reflective of the systematic deviations in the time interval. Applying the previously mentioned variables, this would signify that new number n_new of the pulses to be output is expressed as:

$$n\_new = n + m + a$$

The data value which, at this point, is to be provided as a second input quantity to the adder circuit, could be derived in this context as a quotient, whose numerator is given by the new number of pulses n_new to be transmitted, and whose denominator is derived from the time interval.

It is also possible that potentially occurring rounding errors are taken into consideration when calculating the data value, in that the number of pulses to be output within the time interval is added to a correction value, such as 0.5, for example, before being set in proportion to the time interval.

In another specific embodiment of the circuit configuration provided in accordance with the present invention, it is conceivable that, upstream of the first adder circuit, the circuit configuration encompass a second adder circuit having signed values that provides the first adder circuit with the second input quantity. In this context, it may be a question of a pulse generator, for example, as described in the European Examined Patent Application EP 1 101 162 B1. A pulse generator of this kind employs an adder circuit having signed values.

The present invention also relates to a method for generating pulses within a time interval on the basis of an input signal, the duration of the time interval being predicted on the basis of at least two defined changes in input signals, and an above described circuit configuration being provided in accordance with the present invention.

Further advantages and embodiments of the present invention will become readily apparent from the description and the appended drawings.

It is understood that the aforementioned features and those which are still to be explained in the following may be used not only in the particular stated combination, but also in other combinations or alone, without departing from the scope of the present invention.

DETAILED DESCRIPTION OF THE INVENTION

Figure 1:
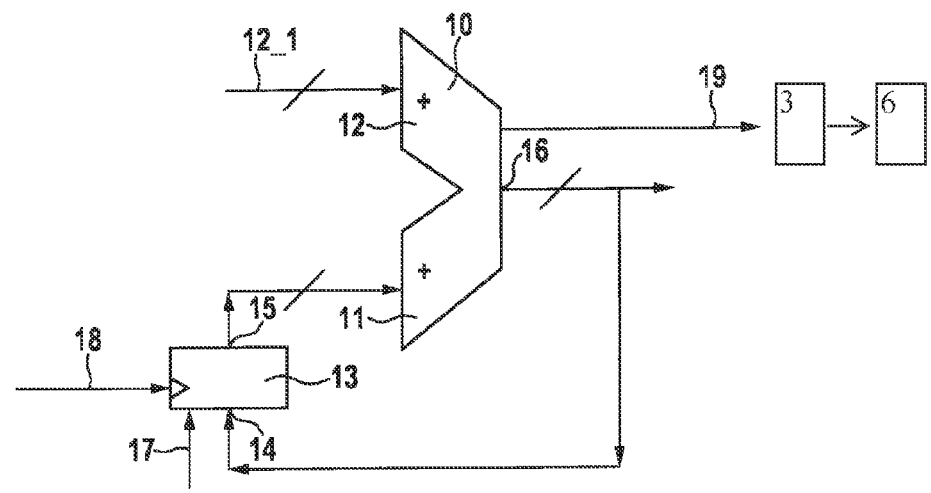
FIG. 1 shows a schematic representation of a specific embodiment of the circuit configuration presented in accordance with the present invention.

The present invention is schematically illustrated in the drawings on the basis of specific embodiments and is described in detail in the following with reference to the drawings. A detailed description of design and function is provided.

FIG. 1 shows a schematic representation of a detail of a specific embodiment of the circuit configuration provided in accordance with the present invention. Illustrated is an adder circuit 10 having a first adder input 11 and a second adder input 12. Also shown are memory elements 13. Memory elements 13 include an input 14 and an output 15. Output 15 of memory elements 13 is linked to first input 11 of adder circuit 10. In addition, output 16 of adder circuit 10 is linked to input 14 of the memory elements.

A circuit configuration provided in accordance with the present invention first predicts a current time interval $\Delta t(0)$. Such a prediction may, for example, be based on the assumption that current time interval $\Delta t(0)$ is exactly as long as preceding time interval $\Delta t(-1)$. However, a plurality of past time intervals may also be retrieved to permit a more precise calculation. The predictive value generally relates to a differential value of a corresponding time base that is formed as a numerator and increments a specific clock pulse. This specific clock pulse is referred to as time stamp clock (TS_CLK) in the following. If, at this point, the number of pulses to be transmitted is set in proportion to predicted time interval $\Delta t(0)$, then a value ADD_IN is derived, which may be applied to adder circuit 10 via input 12, as is indicated by arrow 12_1. The value at adder output 16 is stored at clock pulse TS_CLK 18 in memory elements 13. The memory elements may be flipflop circuits, for example. Output 15 of these memory elements 13 is linked to input 11 of adder circuit 10. A reset signal 17 sets memory elements 13 to 0 at the beginning of the time interval. A circuit configuration of this kind is used to add the ADD_IN value at each clock pulse TS_CLK 18 to form a cumulative value. As soon as this value exceeds a range of numbers limited to a specific bit width, an overflow is generated, and the overflow bit positions are lost. This overflow is a pulse 19 that the circuit configuration is supposed to generate and that is supposed to be counted in a corresponding counter unit 3 associated with the circuit configuration and compared to a setpoint value by a comparator unit 6 associated with the circuit configuration.

If it turned out that a motor acceleration took place in a preceding time interval, for example, and, for that reason, not all pulses could be output that were to be output in accordance with the setpoint value, then at this point, in subsequent, i.e., current time interval $\Delta t(0)$, number m of the pulses missing in the most recent time interval are now added to a number of pulses n to be output in the current interval (in accordance with the setpoint value). In addition, pulses a, which are to be additionally transmitted due to a systematic deviation of the current time interval, may also be added. It is to be noted that number a may be negative, as well as positive, depending on the systematic deviation in the corresponding time interval. Thus, a new number of pulses to be transmitted is derived for current time interval $\Delta t(0)$. As mentioned above, this new number of pulses to be transmitted is expressed by the following equation:

$$n\_new = n + m + a$$

Thus, the resulting ADD_IN value is derived from the following equation:

$$ADD\_IN = n\_new / \Delta t(0)$$

In addition, it is possible to compensate for rounding errors in the calculation by adding the value 0.5 to new number n_new of pulses to be transmitted, before new number n_new is set in proportion to the time interval. Since, in addition, the reciprocal value of time interval $\Delta t(0)$ may, in some instances, also be required for other calculating operations, it may be useful for this reciprocal value rt to be calculated once and stored accordingly. In this context, the storing may be carried out as a binary value having 24 bits and correspond to the $2^{24}$ value of the corresponding result. If the value of n_new is limited to 20 bits, thus, value n_new+0.5 is obtained by shifting n_new by one bit position to the left and replacing what is generally referred to as LSB (least significant position) by a 1, which may be expressed by equation:

$$ADD\_IN = (n\_new + (0.5)) * rt \text{ by } rt = 1/\Delta t(0)$$

As a result, corresponding adder circuit 10 should make at least 24÷20+1=45 bits available as a result value. In this context, however, the least significant position LSB is to be discarded, since value n_new was shifted by 1 bit. A 1 can never occur in the uppermost 20 bits when the number of pulses to be transmitted is smaller than the number of clock pulses TS_CLK in predicted time interval Δt(0). Therefore, only the lower 24 bits are used as ADD_IN value via the LSB.

Figure 2:
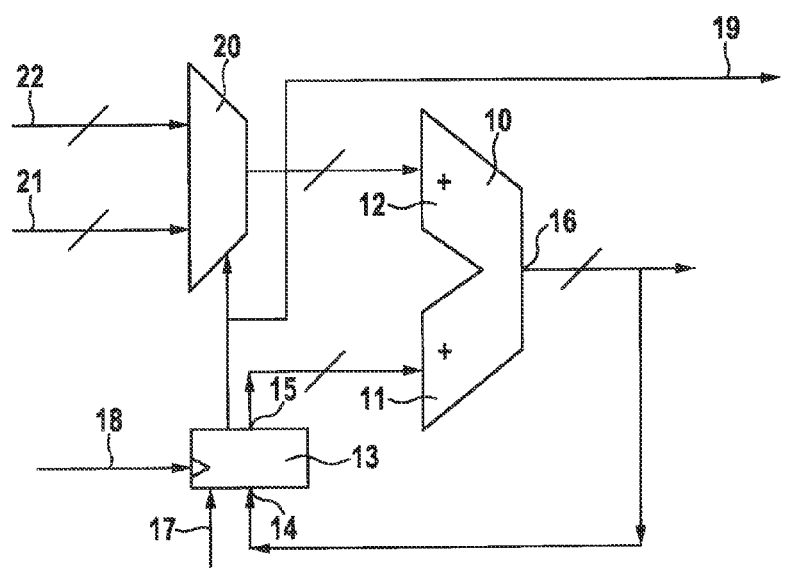
FIG. 2 shows a schematic representation of another specific embodiment of a circuit configuration presented in accordance with the present invention.

FIG. 2 shows another specific embodiment of the circuit configuration provided in accordance with the present invention. In this context, a pulse generator is used, as is described in the European Examined Patent application EP 11 011 62 B1. This pulse generator employs a second adder circuit 20 having signed values. At this point, the predictive value of interval Δt(0) 21 is first fed in accordance with the present invention via a multiplexer to second input 12 of first adder circuit 10. Meanwhile, other input 11 is connected to memory elements 13, which are initially 0. Following a first summing operation, negative value 22 of the calculated pulse duration of the pulses is applied. This value is continually subtracted from the first value until a negative value is obtained in memory elements 13. In this case, a pulse 19 is output, and value Δt(0) is again fed via the multiplexer to first adder circuit 10. In this specific embodiment, as well, the setpoint value of pulses n to be output may be replaced with a modified new value n_new, as is described in the context of FIG. 1. Pulses to be made up for are thereby considered as well in the specific embodiment shown here of the pulse generator. The task of the pulses ends when the setpoint value for the current time interval is reached. To this end, as described above, a counting unit is used which counts the output pulses and, upon reaching the setpoint value, halts a further pulse generation for the current time interval.

What is claimed is:

1. A method for generating pulses within a time interval based on input signals, the method comprising:
    triggering a first adder circuit at a beginning of a time interval based on clock pulses, for generating and outputting output pulses, wherein the adder circuit includes a first adder input and a second adder input;
    transmitting via the first adder input a first input signal quantity associated with a previous clock pulse, which is a sum output by the first adder circuit to the first adder circuit;
    transmitting via the second adder input a second input signal quantity, which includes at least one calculated data value, to the first adder circuit;
    predicting a duration of the time interval based on at least two defined changes in the first input signal and the second input signal, wherein the duration of the time interval is a current time interval Δt(0) that is based on assuming that the current time interval Δt(0) is as long as one or a plurality preceding time intervals;
    considering, upon calculation of the data value, at least one of (i) a deviation in the number of pulses output in a preceding time interval from a setpoint value, and (ii) a systematic deviation in the time interval;
    counting the number of generated output pulses with a counting unit; and
    comparing the number of generated output pulses to a setpoint value with a comparator unit and ending the generation of the output pulses when the number of generated output pulses reaches the setpoint value or when the time interval ends;
    wherein an output of the first adder circuit is connected to an input of a memory element, which includes an input and an output, the output of the memory element being connected to the first input of the first adder circuit.

2. The method as recited in claim 1, wherein the calculated data value corresponds to a ratio between the number of pulses to be output within the time interval and the predicted duration of the time interval.

3. The method as recited in claim 2, wherein the number of pulses to be output corresponds to a sum of (i) the setpoint value, (ii) the deviation in the number of pulses output in the preceding time interval from the setpoint value, and (iii) a number of pulses representing the systematic deviation in the time interval.

4. The method as recited in claim 2, wherein in the calculation of the data value, potential rounding errors are considered by adding the number of pulses to be output within the time interval to a correction value to generate a corrected number of pulses to be output, and wherein the calculated data corresponds to a ratio between the corrected number of pulses to be output and the time interval.

5. The method as recited in claim 1, wherein a second adder circuit outputs signed values to the first adder circuit as the second input quantity.

6. The method as recited in claim 1, wherein the generating and outputting of the output pulses are triggered by an overflow of the adder circuit.

7. A method for generating pulses within a time interval, the method comprising:
    providing a predictive value by predicting a current time interval, based on the assumption that the current time interval corresponds to at least one preceding time interval, wherein the current time interval is Δt(0) and it is based on assuming that the current time interval Δt(0) is as long as one or a plurality preceding time intervals;
    deriving, if a number of pulses to be transmitted is set in proportion to the predicted time interval, an adder value, and applying it to an adder via an input of the adder;
    storing the adder value at an output of the adder at a clock pulse in a memory arrangement;
    adding the adder value at each clock pulse to form a cumulative value;
    generating, when the cumulative value exceeds a range of numbers limited to a specific bit width, an overflow, so that the overflow bit positions are lost, the overflow being a pulse; counting the pulses with a counting unit;
    comparing the number of generated output pulses to a setpoint value with a comparator unit;
    adding, if not all pulses could be output that were to be output in accordance with the setpoint value, in the current time interval, a number of the pulses missing in a most recent previous time interval to a number of pulses to be output in the current time interval, in accordance with the setpoint value;
    deriving a new number of pulses to be transmitted for the current time interval based on the following equation: n_new=n+m+a; and
    deriving the adder value based on the following equation: ADD_IN=n_new/Δt(0);
    wherein n=number of pulses to be output in the current time interval, m=number of the pulses missing in the most recent previous time interval, a=systematic deviation of the current time interval, and Δt(0)=current time interval, and
    wherein an output of the first adder circuit is connected to an input of a memory element, which includes an input and an output, the output of the memory element being connected to the first input of the first adder circuit.

8. The method of claim 7, wherein the predictive value relates to a differential value of a corresponding time base that is formed as a numerator and increments a specific clock pulse, which is a time stamp clock.

9. The method of claim 7, wherein the memory arrangement includes flipflop circuits, and wherein an output of the memory arrangement is linked to the input of the adder.

10. The method of claim 7, wherein a number of pulses, which are to be additionally transmitted due to a systematic deviation of the current time interval, are also added, and wherein the number of pulses may be negative or positive depending on the systematic deviation in a corresponding time interval.

11. The method of claim 7, further comprising:
compensating for rounding errors in the calculation by adding a fixed value to a new number n_new of pulses to be transmitted, before new number n_new is set in proportion to the time interval.

12. The method of claim 7, wherein the predictive value relates to a differential value of a corresponding time base that is formed as a numerator and increments a specific clock pulse, which is a time stamp clock, wherein the memory arrangement includes flipflop circuits, and wherein an output of the memory arrangement is linked to the input of the adder, and wherein a number of pulses, which are to be additionally transmitted due to a systematic deviation of the current time interval, are also added, and wherein the number of pulses may be negative or positive depending on the systematic deviation in a corresponding time interval.

13. The method of claim 12, further comprising:
compensating for rounding errors in the calculation by adding a fixed value to a new number n_new of pulses to be transmitted, before new number n_new is set in proportion to the time interval.

14. The method of claim 13, wherein the fixed value is 0.5, and wherein if the value of n_new is limited to 20 bits, value n_new+0.5 is obtained by shifting n_new by one bit position to the left and replacing what is generally referred to as LSB (least significant position) by a 1, which may be expressed by the following equation: ADD_IN=(n_new+(0.5))*rt by rt=1/$\Delta t(0)$.

15. The method of claim 14, wherein the adder circuit makes at least 24+20+1=45 bits available as a result value, wherein the least significant position LSB is to be discarded, since value n_new was shifted by 1 bit, since a 1 does not occur in the uppermost 20 bits when the number of pulses to be transmitted is smaller than the number of clock pulses in the predicted time interval, so that only the lower 24 bits are used as the adder value via the LSB.

16. The method of claim 7, wherein the predictive value of the current time interval is first fed in accordance via a multiplexer to a second input of the first adder circuit, wherein following a first summing operation, a negative value of the calculated pulse duration of the pulses, and wherein this value is continually subtracted from the first value until a negative value is obtained in the memory arrangement, wherein, in this case, a pulse is output, and the current time value is again fed via the multiplexer to the first adder circuit.

17. The method of claim 15, wherein the setpoint value of pulses n to be output is replaced with a modified new value n_new, and wherein the task of the pulses ends when the setpoint value for the current time interval is reached when the counted output pulses reach the setpoint value, so as to halt a further pulse generation for the current time interval.

* * * * *